United States Patent [19]
Ohkawa et al.

[11] Patent Number: 4,612,515
[45] Date of Patent: Sep. 16, 1986

[54] PLL HAVING PHASE COMPARATOR WITH HYSTERESIS CHARACTERISTICS

[75] Inventors: Michihisa Ohkawa; Hideo Kobayashi, both of Tokyo, Japan

[73] Assignee: Kokusai Denshin Denwa Co., Ltd., Tokyo, Japan

[21] Appl. No.: 749,848

[22] Filed: Jun. 28, 1985

[30] Foreign Application Priority Data

Jul. 4, 1984 [JP] Japan .................. 59-137269

[51] Int. Cl.$^4$ ............................................. H03L 7/06
[52] U.S. Cl. ........................................ 331/1 A; 331/17
[58] Field of Search ............... 331/1 A, 12, 17, 25, 331/27; 307/479, 511, 512, 514, 516, 526, 527, 528, 529; 328/133, 134

[56] References Cited

U.S. PATENT DOCUMENTS

| | | | |
|---|---|---|---|
| 3,610,954 | 10/1971 | Treadway | 307/528 |
| 4,277,754 | 7/1981 | Minakuchi | 328/133 |
| 4,470,018 | 9/1984 | Steinlin | 328/133 |

OTHER PUBLICATIONS

"Analysis of Carrier Recovery Circuit for Coherent Detection of TDMA Signal", Takuro Muratani et al., Transaction of Institute of Electronics and Communication Engineers of Japan, Apr. 1971, vol. 54-B, No. 4, pp. 160-167.

*Primary Examiner*—Eugene R. LaRoche
*Assistant Examiner*—D. C. Mis
*Attorney, Agent, or Firm*—Armstrong, Nikaido, Marmelstein & Kubovcik

[57] ABSTRACT

A phase synchronization circuit of a phase lock loop having a phase comparator, a loop filter or a low-pass filter and a voltage controlled oscillator controlled by output of said loop filter has been improved by a phase comparator having the hysterisis characteristics in which one of a pair of output levels is provided for each input phase difference according to phase error direction, except in the vicinity of a stable point of phase.

4 Claims, 16 Drawing Figures

Fig. 7(a) PHASE COMPARATOR OUTPUT

PLL HAVING PHASE COMPARATOR WITH HYSTERESIS CHARACTERISTICS

BACKGROUND OF THE INVENTION

The invention is concerned with a phase synchronizing circuit or a phase lock loop that follows the frequency and the phase of its input signal.

The conventional phase synchronizing circuit of the PLL (Phase Lock Loop) type has been widely used, e.g., as in a carrier regeneration circuit that provides a reference signal required in demodulating a phase modulated wave or a frequency tracking circuit that traces an electromagnetic wave.

The phase synchronizing circuit of the PLL type, however, has a deterioration in the phase pull-in characteristic known as the hangup phenomenon, and this makes it difficult to use the circuit in fields that require high speed synchronization.

In the first place, let's show a circuit of the PLL type as an example, and explain the hangup phenomenon.

The basic functional block diagram of a circuit of the PLL type is shown in FIG. 1. In FIG. 1, 1 stands for an input terminal for signal, 2 stands for a voltage controlled oscillator (V.C.O.), 3 stands for a phase comparator, 4 stands for a loop filter, 5 stands for an output terminal for phase synchronized signal. If a coming signal is modulated, its modulating components are assumed to be removed before it is applied to the input terminal 1.

The circuit of FIG. 1 is designed to provide the output signal of voltage controlled oscillator 2 that is synchronized in frequency and phase with an input signal at input terminal 1. That is, the phase comparison between an input signal and the output signal of voltage controlled oscillator 2 is performed at phase comparator 3, and the phase difference obtained is fed back, as a voltage, to voltage controlled oscillator via loop filter 4, so that the frequency and the phase of the output signal of voltage controlled oscillator 2 trace the frequency and the phase of the input signal respectively.

An example of the phase comparison characteristic of phase comparator 3 is shown in FIG. 7(a). This is well known as the sinusoidal characteristic and has been popularly used in practical applications.

In FIG. 7(a), x axis represents the phase difference between the phase of an input signal and that of the output signal of voltage controlled oscillator 2, and y axis represents the output signal (or error voltage) of phase comparator 3.

From FIG. 7(a), it is easily seen that if the phase difference between an input signal and the output signal of voltage controlled oscillator 2 becomes $\pi$ (or 180°) the corresponding output signal of phase comparator 3 becomes zero, and the oscillating phase of voltage controlled oscillator 2 gets stable leaving the phase difference $\pi$ unchanged. Therefore, synchronization cannot be established. This condition is a so-called hangup phenomenon. Even when the phase difference is not exactly equal to $\pi$ but almost equal to $\pi$, the condition can be considered as a hangup phenomenon in practical application. If the phase difference is not so near to $\pi$ but in the vicinity of $\pi$, it takes a long time to establish synchronization as the output of phase comparator is very small. These are drawbacks of the conventional phase synchronizing circuit.

The drawbacks make it difficult to use a phase synchronizing circuit having the phase comparison characteristic of FIG. 7(a) as a carrier regeneration circuit for use in demodulating a time-division multiple-access (TDMA) signal composed of a number of mutually asynchronous bursts. The reason is that the circuit should give a reference signal for each burst in demodulating the TDMA signal, and this requires the circuit's performance to establish synchronization in a quite short time.

Meanwhile, methods are proposed to remove the said drawbacks of the conventional phase synchronizing circuit in a paper titled "Examination of carrier generation circuits for use in synchronized demodulation of TDMA signals." (Trans. of the Institute of Electronics and Communication Engineers of Japan, Vol. 54-B, No. 4, pp. 160/167.)

According to one of the methods, phase comparator 3 in the circuit of the PLL type shown in FIG. 1 has a phase comparison characteristic that gives a saw-tooth waveform against phase difference as shown in FIG. 7(b). The phase comparison characteristic is considered effective in bringing about high speed synchronization converging to stabilize a phase difference point such as 0 or $2\pi$, by providing a large output amplitude when a phase difference is in the vicinity of $\pi$. Even in this method, however, if an input signal contains some phase jitter or noise, the outputs around the phase difference $\pi$ get averaged and this causes the saw-tooth phase comparison characteristic of FIG. 7(b) change to an equivalent phase comparison characteristic such as shown in FIG. 7(c). Therefore, time required in establishing synchronization becomes longer than is expected in design.

Another method described in the paper is called a kick-off method. In this method, measurement of an initial phase difference is done when a process for synchronization gets started, and if the measured phase difference is in the vicinity of $\pi$, a phase shift of $\pi$ is forced to occur in the output signal of the voltage controlled oscillator to move the initial hangup region (or $\pi$-neighborhood) to a stable region (e.g., 0-neighborhood). The method, however, has a drawback that it is of no use if the beginning time point of a synchronizing process fails to be detected. In addition, with an input signal containing some noise, misjudging problems concerning hangup phenomena may arise, e.g., such cases as overlooking an existing hangup phenomenon or triggering a phase shift of $\pi$ when no hangup phenomenon really exists. Therefore, these methods do not give a perfect solution for the hangup phenomenon.

SUMMARY OF THE INVENTION

It is an object, therefore, of the present invention to provide a new and improved phase lock loop.

It is also an object of the present invention to provide a phase lock loop which is free from the conventional hangup problem, and can establish locked phase in a short time.

The above and other objects are attained by a phase lock loop comprising a phase comparator which receives an input signal, a loop filter coupled with output of said phase comparator, a voltage controlled oscillator coupled with output of said loop filter to provide an output frequency signal to said phase comparator and a phase locked output signal, wherein said phase comparator has hysterisis characteristics in which one of pair of outputs are provided for each input phase difference according to phase error direction, except for vicinity of a stable point of phase.

BRIEF DESCRIPTION OF THE DRAWINGS

The foregoing and other objects, features, and attendant advantages of the present invention will be appreciated as the same become better understood by means of the following description and accompanying drawings wherein;

FIGS. 4(a)-4(h) show operational waveforms of the circuit of FIG. 3.

DESCRIPTION OF THE PREFERRED EMBODIMENTS

Figure 1:
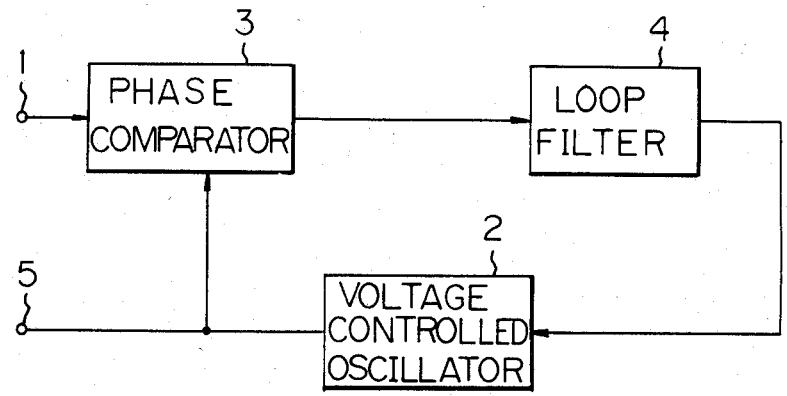
FIG. 1 is a block diagram of a phase lock loop according to the present invention.
Figure 2:
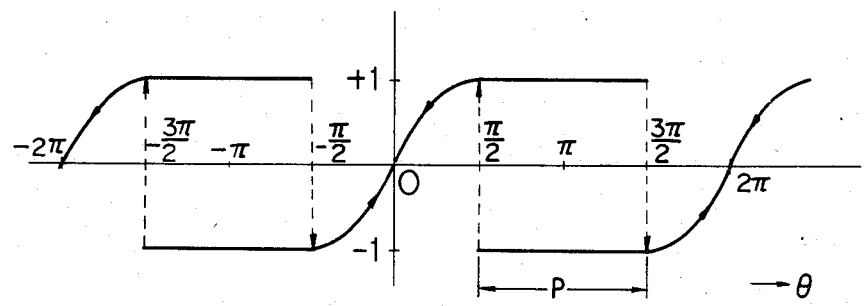
FIG. 2 shows the characteristics curve of the phase comparator 3 in FIG. 1.

FIG. 1 shows an embodiment of the invention. The basic function of this circuit is that the oscillating output signal of voltage controlled oscillator 2 gets controlled to synchronize with the frequency and the phase of an input signal at input terminal 1. The important feature of the present invention is that the phase comparator 3 has a hysteresis characteristic with a period of $2\pi$ that is shown in FIG. 2 as its phase comparison characteristic. In FIG. 2, x axis (horizontal axis) represents $\theta$, the phase difference between an input signal and the output signal of voltage controlled oscillator 2, while y axis (vertical axis) represents the output signal level of phase comparator 3. Also, in FIG. 2, each arrow mark indicates a controlled direction (or converging direction) of voltage controlled oscillator 2, i.e., a direction to which voltage controlled oscillator 2 is controlled to change.

If $\theta$ stands for the phase difference between an input signal and the output signal of voltage controlled oscillator 2, the output signal of phase comparator 3 is basically given as follows.

| range of $\theta$. | phase comparator 3's output |
|---|---|
| $-\frac{3\pi}{2} < \theta \leq -\frac{\pi}{2}$ | $-1$ |
| $-\frac{\pi}{2} < \theta \leq +\frac{\pi}{2}$ | $\sin \theta$ |
| $+\frac{\pi}{2} < \theta \leq +\frac{3\pi}{2}$ | $+1$ |

If $\theta$ is initially in a range $(-3\pi/2, +3\pi/2)$ voltage controlled oscillator 2 is controlled by the output signal of phase comparator 3 so that $\theta$ converges to 0, the origin of FIG. 2.

Now, let's explain how the hysteresis characteristic works. Assume, for example, that $\theta$ increases and exceeds $+3\pi/2$, the output of phase comparator 3 jumps down to $\sin \theta$ from $+1$. This is equivalent to a phase shift of $-2\pi$ in $\theta$ and this makes the $\theta$'s converging point change to a point denoted by $2\pi$ in FIG. 2. Next, $\theta$ is supposed to decrease. When $\theta$ is in a range of $(\pi/2, 3\pi/2)$, the range is regarded as that of $(-3\pi/2, -\pi/2)$ with the point $2\pi$ as a new origin of measurement, and the output of phase comparator 3 remains $-1$. When $\theta$ passes through $\pi/2$, the output of phase comparator 3 jumps up to $\sin \theta$ again from $-1$. This is equivalent to a phase shift of $2\pi$ and cancels the previous phase shift and the converging point of $\theta$ returns back to the initial point, i.e., point 0 again. After this, if $\theta$ increases again and exceeds $\pi/2$, the output of phase comparator 3 becomes $+1$.

In this way, the output of phase comparator 3 varies on a square hysteresis loop shown in FIG. 2 if $\theta$ varies in an interval whose center is point $\pi$ (or point $-\pi$) and whose width is $\pm\pi/2$. The hysteresis characteristic of phase comparator 3 removes the drawbacks of the conventional phase synchronizing circuit as explained below.

Figure 7B:
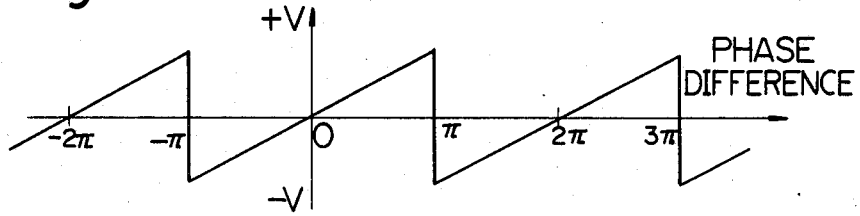
Figure 7C:
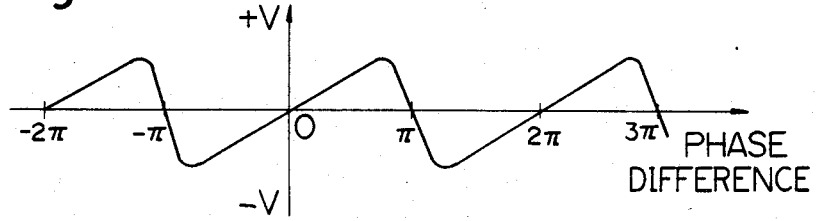

Comparing FIG. 7(a) with FIG. 2, it is easily seen that no hangup phenomenon happens in a phase synchronizing circuit with the phase comparison characteristic of FIG. 2, as the output of phase comparator 3 for any phase difference that is not at a converging point (denoted by $-2\pi$, 0, or $+2\pi$ in FIG. 2) never approaches zero. Moreover, if $\theta$ is deviated more than $+\pi/2$ or $-\pi/2$ from a converging point, the output of phase comparator 3 does not decrease, but becomes maximum in amplitude. This makes the output of voltage controlled oscillator 2 converge rapidly.

FIG. 2 shows a hysteresis characteristic whose width (p) is 180° ($\pi$) as an example. Considering such factors as phase pull-in range, input signal's phase variation due to noise or phase jitter, a hysteresis width of greater or less than $\pi$ can be chosen with the same effect of the invention.

Figure 3:
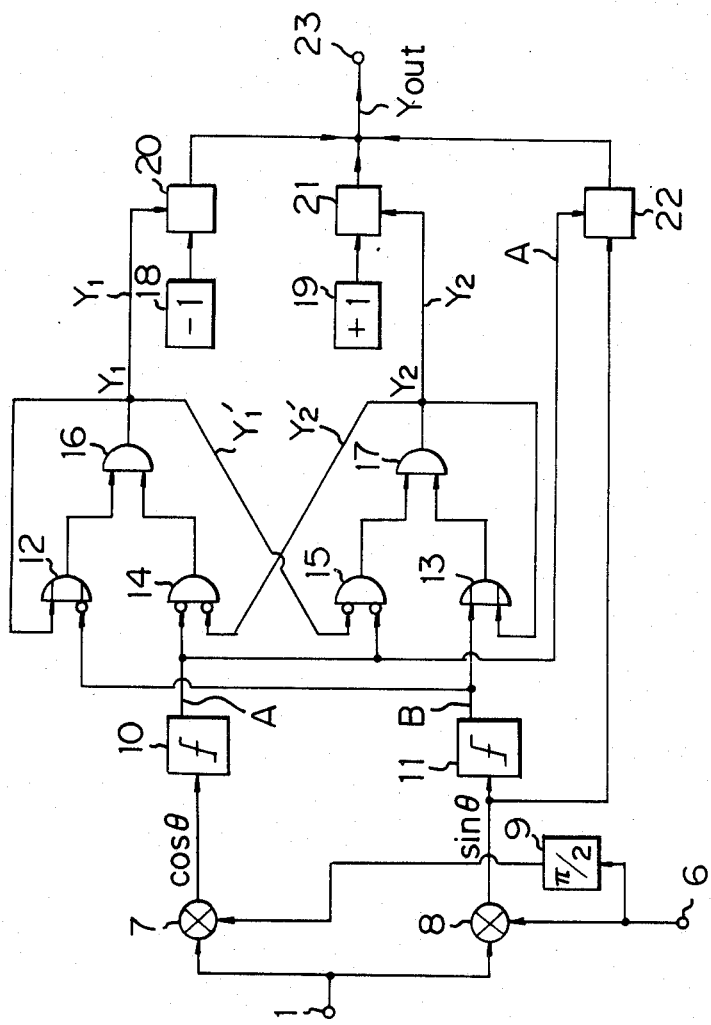
FIG. 3 is a block diagram of the phase comparator according to the present invention.

An example of the circuit structure of phase comparator 3 having the phase comparison characteristic of FIG. 2 is shown in FIG. 3. Therefore, the hysteresis width (p) of the above example is 180° ($\pi$).

In FIG. 3, 1 stands for an input terminal for signal, 6 stands for an input terminal for signal from voltage controlled oscillator 2, each of 7 and 8 stands for a phase detector, 9 stands for a phase shifter of $\pi/2$ radian, each of 10 and 11 stands for a level discriminator, each of 12 and 13 stands for an OR-gate, each of 14, - - -, 17 stands for an AND-gate, 18 stands for a voltage source whose output is constant and is denoted by $-1$ in FIG. 2, 19 stands for a voltage source whose output is constant and is denoted by $+1$ in FIG. 2, each of 20, 21, and 22 stands for a gate, 23 stands for an output terminal. Small circles drawn in front of OR-gate 12, AND-gate 14 and AND-gate 15 represent the logical function of "not".

An input signal at input terminal 1 gets phase-detected by means of the output signal of voltage controlled oscillator 2 at input terminal 6, phase detector 7, and phase detector 8. If the phase difference between an input signal at input terminal 1 and a signal at input terminal 6 is denoted by $\theta$ as before, the outputs of phase detector 7 and phase detector 8 can be represented by $\cos \theta$ and $\sin \theta$ respectively by means of the phase shift performed by phase shifter 9. At level discriminators 10 and 11, these output signals, depending on whether their values are positive or negative, are converted to the corresponding logical signals. The logical signals thus obtained are processed in a logical circuit explained below.

Let's explain the logical process with FIG. 4 as an aid. In FIG. 4, signal waveforms at the parts mentioned above are shown with relation to the phase comparison characteristic curve.

That is, (a) is the output waveform of phase detector 7 (cosine wave), (b) is the output waveform of phase detector 8 (sine wave), (c) is the output waveform of level discriminator 10 (denoted by A), (d) is the output waveform of level discriminator 11, (denoted by B), (e) shows two patterns composed of 0's and 1's which represent the logical levels of A and those of B respectively, (f) gives region numbers named in relation to (c), (d), and (e), (g) is the phase comparison characteristic.

For convenience's sake, signals at (c) and (d) are called A and B respectively.

Figure 4A:
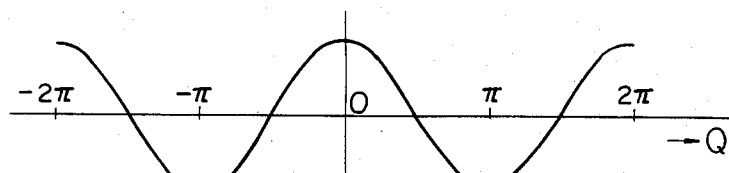
Figure 4B:
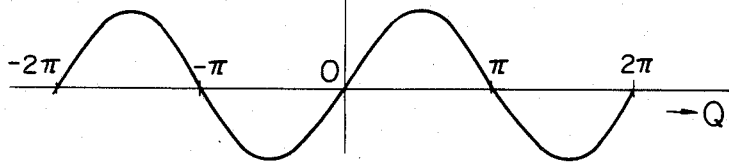
Figure 4B:
Figure 4B:
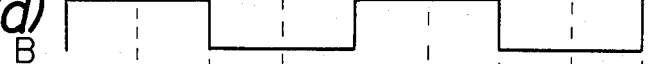
Figure 4E:
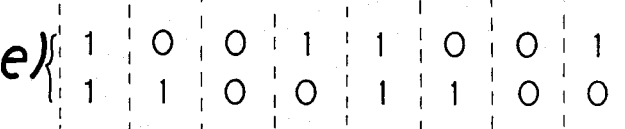
Figure 4F:
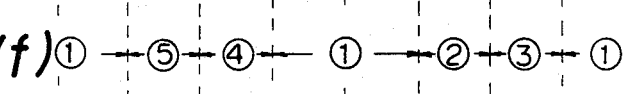
Figure 4G:
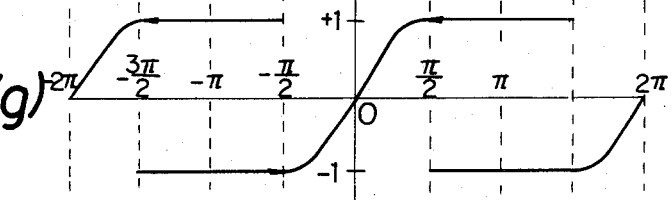
Figure 4H:
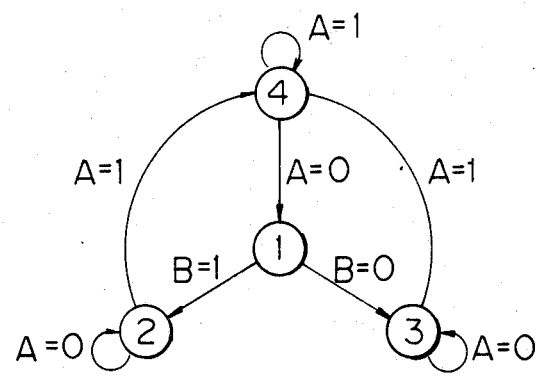

In the first place, region (1), where the phase comparison characteristic shown in FIG. 4(g) is represented by a sine curve, is defined solely by A="1" and independent of B's logical value. Therefore, in the circuit shown in FIG. 3, signal A controls gate 22 so that the output of phase detector 8, i.e., sin $\theta$, appears at output terminal 23 by way of gate 22 whenever A becomes "1".

The following logical process is performed concerning regions (2), (3), (4), and (5) of FIG. 4(f).

In FIG. 3, if the output of AND-gate 16 and the output of AND-gate 17 are denoted by $Y_1$ and $Y_2$ respectively, $Y_1$ and $Y_2$ are represented by the following logical expressions.

$$Y_1 = \overline{A} \cdot \overline{Y_2'} \cdot (Y_1' + \overline{B}) \qquad (1)$$

$$Y_2 = \overline{A} \cdot \overline{Y_1'} \cdot (Y_2' + B) \qquad (2)$$

where $Y_1'$ and $Y_2'$ represent what $Y_1$ and $Y_2$ were just a moment ago respectively.

When $Y_1$ of expression (1) becomes "1", it opens gate 20 and $-1$ appears at output terminal 23. In the same way, when $Y_2$ of expression (2) becomes "1", it opens gate 21 and $+1$ appears at output terminal 23.

Table 1, the truth table of the above logical process, shows what is explained more clearly. Besides the truth table relationship, Table 1 contains information useful in understanding the process. That is, "Y out" means an output signal appearing at output terminal 23, and "State", "Region" are defined in FIG. 4(h), FIG. 4(f) respectively.

To begin with, when A is "1", the operating condition is state 4 independent of B's logical value, and both $Y_1$ and $Y_2$ are "0" as expressions (1) and (2) show. Therefore, as explained earlier, Y out is sin $\theta$. This is defined region (1) in FIG. 4(f).

At this operating condition, if $\theta$, the phase difference, goes out from the converging point a bit more than $-\pi/2$ or $+\pi/2$, A becomes "0". As $(Y_1, Y_2)=(0, 0)$ when A was "1", $(A, Y_1', Y_2')$ turns to $(0, 0, 0)$, and the operating condition is transferred to state 1 from state 4. At this time, if B is "0", as expression (1) shows, $Y_1$ becomes "1" and $Y_{out}$ becomes $-1$.

TABLE 1

| State | Input | | | | Output | | | Region |
|---|---|---|---|---|---|---|---|---|
| | A | $Y_1'$ | $Y_2'$ | B | $Y_1$ | $Y_2$ | Y out | |
| 1 | 0 | 0 | 0 | 0 | 1 | 0 | $-1$ | (4) |
| | 0 | 0 | 0 | 1 | 0 | 1 | $+1$ | (2) |
| 2 | 0 | 0 | 1 | 1 | 0 | 1 | $+1$ | (2) |
| | 0 | 0 | 1 | 0 | | | | (3) |
| 3 | 0 | 1 | 0 | 1 | 1 | 0 | $-1$ | (5) |
| | 0 | 1 | 0 | 0 | | | | (4) |
| 4 | 1 | 1 | 0 | 0 | 0 | 0 | sin | (1) |
| | 1 | 1 | 0 | 1 | | | | |
| | | | | 1 | | | | |

TABLE 1-continued

| State | Input | | | | Output | | | Region |
|---|---|---|---|---|---|---|---|---|
| | A | $Y_1'$ | $Y_2'$ | B | $Y_1$ | $Y_2$ | Y out | |
| | | | | 0 | | | | |
| | | | | 0 | | | | |
| | | | | 1 | | | | |
| | | | | 1 | | | | |
| | 1 | 0 | 0 | 0 | | | | |

That is, the phase comparison characteristic's region is transferred to region (4) from region (1). In a moment, $(A, Y_1', Y_2')$ becomes $(0, 1, 0)$ and the operating condition turns to state 3. At this operating condition, $Y_{out}$ remains $-1$ independent of B's logical value, in other words, whether the current region is region (4) or region (5). This operating condition, i.e., state 3 continues until the time when A becomes "1" again or the phase comparison characteristic's region turns to region (1) which is caused by either that the phase difference $\theta$ exceeds $-\pi/2$ and a phase shift of $2\pi$ takes place in $\theta$, or that $\theta$ passed through $-\pi/2$ toward zero.

If the phase comparison characteristics region is transferred to region (2) from region (1) by a $\theta$'s positive deviation exceeding $+\pi/2$, the operating condition turns to state 1 and as B is "1", $Y_{out}$ becomes $+1$. In a moment, the operating condition is transferred to state 2 from state 1 and $Y_{out}$ remains $+1$ until the time when the phase comparison characteristic's region is transferred to region (1) again by an appropriate change of $\theta$.

What is explained above is all about the logical performance carried out in the circuit of FIG. 3. Depending on the value of an initial phase difference, the corresponding phase comparison characteristic's region may be one of the four regions other than region (1) which is not included in the above explanation. But, in every possible case, it is easily understood that no hangup phenomenon takes place. The reason why a condition where $(Y_1', Y_2')=(1, 1)$ is missing in the truth table of Table 1 is because the condition is impossible as expressions (1) and (2) indicate. In other words, $(Y_1', Y_2')$ acts like the output of "a kind of" flip-flop.

In the circuit shown in FIG. 3, a hysteresis interval; in which two output levels are exhibited, is chosen to be $(\pi/2, 3\pi/2)$ for ease of design.

In general, it is true that the larger a hysteresis width, which is a length of a hysteresis interval, the greater the effect of "hangup" suppression becomes. Meanwhile, it may happen because of a large hysteresis width that an input signal which would have been synchronized to, e.g., $2\pi$ radian in a shorter time, is forced to be synchronized to 0 radian. That makes the synchronizing time longer. With a short hysteresis width, however, the effect of "hangup" suppression gets weakened for noise that is greater than the hysteresis width. Therefore, a hysteresis interval that is centered at $\pi$ radian and extends to either side by at most $\pi/2$ radian may be reasonable in design. That is, in an ordinary case, the hysteresis interval should be chosen within an interval of $(\pi/2, 3\pi/2)$. If the expected noise in an input signal is small, the shortest possible hysteresis width that overcomes the noise and satisfies the above condition, will bring about the least mean synchronizing time.

Then, let's explain another embodiment of the invention.

Figure 5:
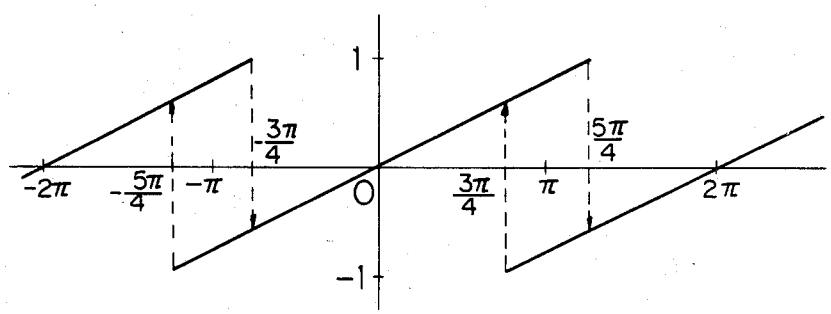
FIG. 5 shows the characteristics of the phase comparator of the other embodiment according to the present invention.

The phase comparison characteristic is somewhat different from the previous embodiment as shown in FIG. 5 and has a period of $2\pi$. A phase comparator with this phase comparison characteristic continues to give a positive output when the phase difference, $\theta$, increases from less than $3\pi/4$ to $5\pi/4$, and when $\theta$ exceeds $5\pi/4$, the output jumps down to a negative value on a lower line as FIG. 5 shows. As this point, if $\theta$ decreases, the output follows the lower line and continues to be negative until the time when $\theta$ reaches $3\pi/4$. It jumps up to the upper line again and becomes positive when $\theta$ becomes less than $3\pi/4$. These phase comparison outputs are represented in digital form, (e.g., in binary number) and are digitally operated in a loop filter. The result, in getting a D/A conversion, becomes its output and controls voltage controlled oscillator 2.

Figure 6:
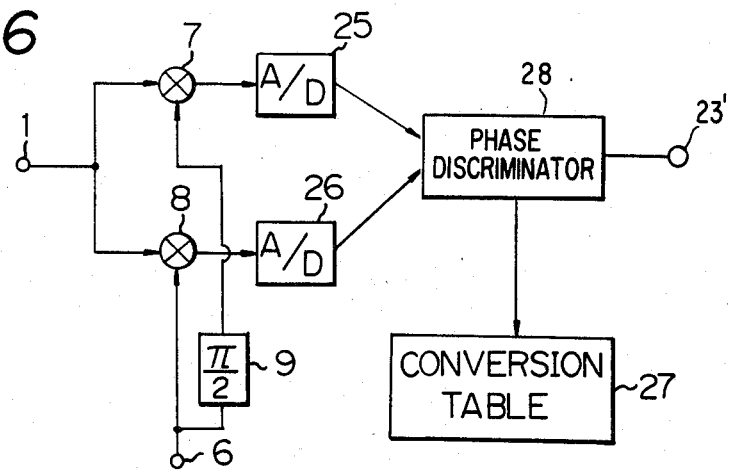
FIG. 6 is a block diagram of the phase comparator which gives the characteristics of FIG. 5, FIGS. 7(a)-7(c) show operational waveforms of a phase lock loop of a prior art.
Figure 6:
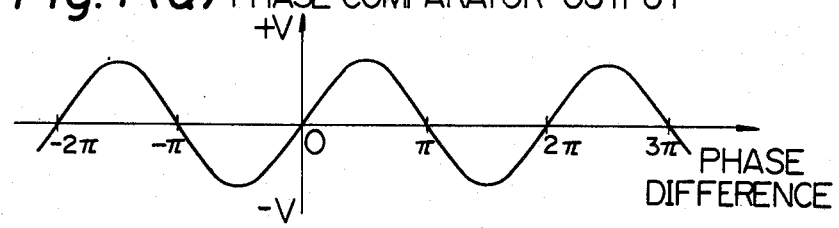

Phase comparator 3 of this embodiment is constructed as shown in FIG. 6. In FIG. 6, 1 stands for an input terminal for signal, 6 stands for an input terminal for output signal of voltage controlled oscillator, each of 7 and 8 stands for a phase detector, 9 stands for a phase shifter of $\pi/2$, 23' stands for an output terminal for phase comparison, each of 25 and 26 stand for an A/D converter, 27 stands for a ROM (Read Only Memory) containing an angle conversion table, 28 stands for a phase discriminator.

In phase comparator 3 shown in FIG. 6, an input signal at input terminal 1 and a signal at input terminal 6 get phase-detected by means of phase detector 7 and phase detector 8. If the phase difference between a signal at input terminal 1 and a signal at input terminal 6 is denoted by $\theta$, the output of phase detector 8 can be represented by $\sin\theta$, while the output of phase detector 7 is given by $\cos\theta$ by the work of phase shifter 9. These outputs are converted to their digital values (e.g., binary numbers) by way of A/D converter 25 and A/D converter 26 respectively, and enter phase discriminator 28 as its inputs. Referring to the said angle conversion table stored in ROM 27 that provides the value of $\theta$ from a given pair of data, i.e., $\cos\theta$ and $\sin\theta$, phase discriminator 28 obtains the value of $\theta$ and determines the corresponding phase comparison output that appears at output terminal 23'. When the value of $\theta$ thus obtained is found in its hysteresis interval, the output is determined as follows.

As the data indicating $\theta$'s value and the corresponding output's value of just one moment ago are stored somewhere in phase discriminator 28, it judges whether $\theta$ is increasing or decreasing and which of the two hysteresis branches $\theta$ is varying on. The judgement determines the current output.

The invention is explained in detail above. A phase synchronizing circuit of the invention has a hysteresis characteristic as its phase comparison characteristic, whose effect provides a large phase comparison output even when the phase difference $\theta$ is in the vicinity of $\pi$. And, if some noise is superposed on an input signal that is with $\theta$ of being in the vicinity of $\pi$, a phenomenon that the phase comparison output approaches zero on average due to the noise's averaging effect expected in the conventional circuit cannot take place because the output varies on one of the two hysteresis branches. Therefore, the hangup phenomenon, which is a great drawback of the conventional phase synchronizing circuit, is eliminated. When $\theta$ is large such as found somewhere between $\pi/2$ and $3\pi/2$, the amplitude of the corresponding phase comparison output signal is large (e.g., +1 in the first embodiment) and this fact brings about a higher speed of phase synchronization compared with that obtained in the conventional circuit.

Moreover, the circuit shown in FIG. 3 provides a much wider range of frequency pull-in than one available in the conventional circuit. That is, if, for example, the frequency of an input signal is larger than that of the output signal of the voltage controlled oscillator, the phase difference $\theta$ is increasing with time and the ouptut point continues to move right on the phase comparison characteristic curve. Therefore, it always on the positive hysterisis branch if $\theta$ is in the hysteresis interval, and the phase comparator's output, i.e., the loop filter's input becomes a fairly large positive voltage on average which makes the frequency of the output signal of the voltage controlled oscillator increase rapidly.

From the foregoing it will now be apparent that a new and improved phase lock loop has been found. It should be understood of course that the embodiments disclosed are merely illustrative and are not intended to limit the scope of the invention. Reference should be made to the appended claims, therefore, rather than the specification as indicating the scope of the invention.

What is claimed is:

1. A phase synchronization circuit comprising:
   a phase comparator which receives an input signal;
   a loop filter coupled with an output of said phase comparator;
   a voltage controlled oscillator coupled with an output of said loop filter to provide an output frequency signal to said phase comparator and a phase locked output signal; and
   wherein said phase comparator has hysteresis characteristics in which one of a pair of output levels are provided for each input phase difference depending on phase error direction immediately before entering the hysteresis region, except in the vicinity of stable points of phase.

2. A phase synchronization circuit according to claim 1, wherein said phase comparator comprises:
   a pair of phase detectors for providing $\sin\theta$ and $\cos\theta$ in which $\theta$ is said phase difference between said input signal phase and said output frequency signal phase;
   a pair of level discriminators coupled with outputs of said phase detectors, respectively, to provide digitized values of outputs of said phase detectors;
   a gate circuit coupled with an output of said level discriminators to provide a control voltage to said voltage controlled oscillator; and
   a logic means for controlling said gate circuit according to said outputs of said phase detectors so that the output of the phase comparator has said hysterisis characteristics.

3. A phase synchronization circuit according to claim 1, wherein the hysteresis interval of the phase comparator is contained in an interval of $(\pi/2, 3\pi/2)$.

4. A phase comparator according to claim 3, wherein the characteristics of the phase comparator have the hysterisis width $\pi$.

* * * * *